United States Patent
Logiudice

(10) Patent No.: US 10,186,859 B2
(45) Date of Patent: Jan. 22, 2019

(54) REVERSE CURRENT PROTECTION FOR A SWITCHING UNIT

(71) Applicant: Infineon Technologies AG, Neubiberg (DE)

(72) Inventor: Andrea Logiudice, Padua (IT)

(73) Assignee: Infineon Technologies AG, Neubiberg (DE)

( * ) Notice: Subject to any disclaimer, the term of this patent is extended or adjusted under 35 U.S.C. 154(b) by 311 days.

(21) Appl. No.: 15/059,121

(22) Filed: Mar. 2, 2016

(65) Prior Publication Data

US 2017/0256939 A1   Sep. 7, 2017

(51) Int. Cl.
*H02H 9/02* (2006.01)
*H02H 9/04* (2006.01)
*H02H 7/22* (2006.01)
*H03K 17/082* (2006.01)

(52) U.S. Cl.
CPC ............. *H02H 9/04* (2013.01); *H02H 7/222* (2013.01); *H02H 9/046* (2013.01); *H03K 17/0822* (2013.01); *H02H 9/02* (2013.01); *H03K 2217/0018* (2013.01)

(58) Field of Classification Search
USPC .................................. 361/18, 56, 93.7–93.9
See application file for complete search history.

(56) References Cited

U.S. PATENT DOCUMENTS

| | | | |
|---|---|---|---|
| 4,998,520 A | 3/1991 | Wright | |
| 5,031,142 A | 7/1991 | Castro | |
| 6,878,996 B2 | 4/2005 | Rothleitner | |
| 7,236,036 B2 | 6/2007 | Branch et al. | |
| 8,203,234 B2* | 6/2012 | Lee | H02J 7/0031 307/326 |
| 8,253,452 B2 | 8/2012 | Kushnarenko | |
| 8,400,193 B2 | 3/2013 | Kollmann | |
| 8,963,590 B2 | 2/2015 | Guimont et al. | |
| 9,019,793 B1 | 4/2015 | Jeong | |
| 2008/0309384 A1 | 12/2008 | Guimont et al. | |

(Continued)

FOREIGN PATENT DOCUMENTS

DE         10223950 B4    8/2005

OTHER PUBLICATIONS

Hong et al., "A Reverse-Voltage Protection Circuit for MOSFET Power Switches," IEEE Journal of Solid-State Circuits, vol. 36, No. 1, Jan. 2001, pp. 152-155.

(Continued)

*Primary Examiner* — Danny Nguyen
(74) *Attorney, Agent, or Firm* — Shumaker & Sieffert, P.A.

(57) ABSTRACT

In one example, a circuit includes a switching unit including a first node, a second node, a control node, and a body. The switching unit is configured to selectively couple the first node of the switching unit to the second node of the switching unit in response to receiving a control signal at a control input of the switching unit. The circuit further includes a reverse current protection unit configured to reduce a current flow from the second node of the switching unit to the first node of the switching unit. The reverse current protection unit selectively couples the first node of the switching unit and the body of the switching unit and selectively couples the second node of the switching unit to the body of the switching unit.

16 Claims, 6 Drawing Sheets

(56) References Cited

U.S. PATENT DOCUMENTS

2012/0206110 A1\* 8/2012 Nishida ................ H02J 7/0034
320/163
2014/0160600 A1\* 6/2014 Maggio .................. H02H 3/18
361/18

OTHER PUBLICATIONS

Lidow et al., "Is it the End of the Road for Silicon in Power Conversion?," Efficient Power Conversion Corporation, 2011, 7 pp. (Applicant points out, in accordance with MPEP 609.04(a), that the year of publication, 2011, is sufficiently earlier than the effective U.S. filing date, Mar. 2, 2016, so that the particular month of publication is not in issue.).
Purschel, "Automotive MOSFETs, Reverse Battery Protection," Automotive Power, Infineon, Application Note, 2.0, Jun. 2009, 15 pp.

\* cited by examiner

REVERSE CURRENT PROTECTION FOR A SWITCHING UNIT

TECHNICAL FIELD

This disclosure relates to switching units, such as units that include a metal-oxide-semiconductor field-effect transistor (MOSFET) or another type of switch.

BACKGROUND

A switching unit may be used as a pass device in driver circuits. For example, the switching unit can be selectively switched (e.g., using pulse width modulation) to control when current flows through a load circuit (e.g., light emitting diodes). In some cases, changes in a supply voltage, a load voltage, or a ground voltage may cause a reverse current (e.g., from a load to a supply) to flow, causing the failure of the switching unit.

SUMMARY

In general, this disclosure is directed to techniques for reducing or blocking reverse current within a switching unit. For instance, reverse current protection may permit switching elements to be used in applications where a load voltage exceeds a supply voltage, where a ground voltage exceeds a supply voltage, or the like.

In one example, a circuit includes a switching unit including a first node, a second node, a control node, and a body, wherein the switching unit is configured to selectively couple the first node of the switching unit and the second node of the switching unit in response to receiving a control signal at a control input of the switching unit; and a reverse current protection unit configured to reduce a current flow from the second node of the switching unit to the first node of the switching unit, wherein the reverse current protection unit selectively couples the first node of the switching unit and a body of the switching unit and selectively couples the second node of the switching unit to the body of the switching unit.

In another example, an integrated circuit includes: a driver unit configured to receive an input signal on an input node of the integrated circuit and to generate a control signal in response to the input signal received on the input node of the integrated circuit; a switching unit including a first node coupled to a voltage rail of the integrated circuit, a second node coupled to an output node of the integrated circuit, and a body, wherein the switching unit is configured to selectively couple the first node of the switching unit and the second node of the switching unit in response to the control signal generated by the driver unit; and a reverse current protection unit configured to reduce a current flow from the second node of the switching unit to the first node of the switching unit, wherein the reverse current protection unit selectively couples the first node of the switching unit to the body of the switching unit and selectively couples the second node of the switching unit to the body of the switching unit.

In another example, a power converter device includes means for selectively coupling a first node of a switching unit and a second node of the switching unit in response to receiving a control signal; and means for switching a body of the switching unit to reduce a current flow from the second node of the switching unit to the first node of the switching unit.

Details of these and other examples are set forth in the accompanying drawings and the description below. Other features, objects, and advantages will be apparent from the description and drawings, and from the claims.

DETAILED DESCRIPTION

Figure 1:
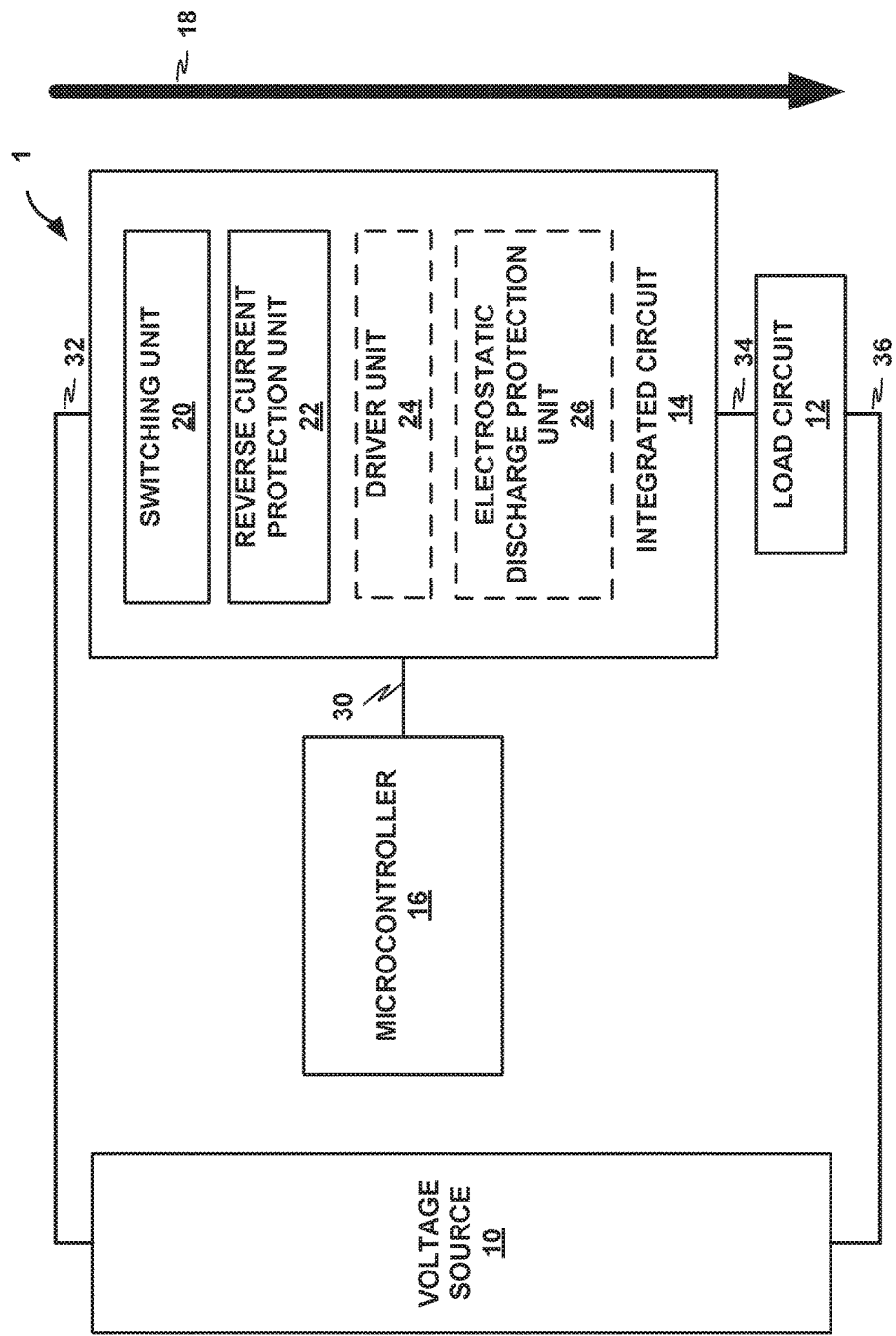
FIG. 1 is a block diagram illustrating an example reverse current protection system, in accordance with one or more techniques of this disclosure.

FIG. 1 is a block diagram illustrating an example reverse current protection system 1, in accordance with one or more techniques of this disclosure. As illustrated in the example of FIG. 1, reverse current protection system 1 may include voltage source 10, load circuit 12, integrated circuit 14, and microcontroller 16.

In some examples, voltage source 10 may be configured to provide electrical power to one or more other components of reverse current protection system 1. For instance, voltage source 10 may be configured to supply an input power to load circuit 12. In some examples, voltage source 10 may be a battery which may be configured to store electrical energy. Examples of batteries may include, but are not limited to, nickel-cadmium, lead-acid, nickel-metal hydride, nickel-zinc, silver-oxide, lithium-ion, lithium polymer, any other type of rechargeable battery, or any combination of the same. In some examples, voltage source 10 may be an output of a power converter or power inverter. For instance, voltage source 10 may be an output of a direct current (DC) to DC power converter, an alternating current (AC) to DC power converter, a DC to AC power inverter, and the like. In some examples, voltage source 10 may represent a connection to an electrical supply grid. In some examples, the input power signal provided by voltage source 10 may be a DC input power signal. For instance, voltage source 10 may be configured to provide a DC input power signal in the range of ~5 VDC to ~40 VDC.

In some examples, load circuit 12 may include a resistive load. For instance, load circuit 12 may include a light emitting diode and/or an array of light emitting diodes. In some examples, load circuit 12 may be a capacitive load. For instance, load circuit 12 may include a capacitive element or a bank of capacitive elements connected in series or parallel. In some examples, load circuit 12 may include an inductive load. For instance, load circuit 12 may include a motor, pump, transformer, and the like.

In some examples, integrated circuit 14 may include a switching unit 20 and a reverse current protection unit 22. In some examples, integrated circuit 14 may optionally include driver unit 24. In some examples, integrated circuit 14 may optionally include electrostatic discharge protection unit 26. In some examples, integrated circuit may include different units. For instance, integrated circuit 14 may include a thermal protection unit to prevent integrated circuit 14 from overheating. In some examples, units of integrated circuit 14 may be formed onto a single chip. For instance, switching unit 20 and reverse current protection unit 22 may be formed on a single chip substrate. In some instances, switching unit 20, reverse current protection unit 22, driver unit 24, and electrostatic discharge protection unit 26 may be formed on a single chip substrate.

In some examples, switching unit 20 may be configured to selectively couple a voltage source 10 to load circuit 12 in response to receiving a control signal. In some examples, switching unit 20 is further configured to operate in a closed state and an open state. For instance, during the closed state switching unit 20 permits current to flow bi-directionally between voltage source 10 and load circuit 12. In some examples, during the open state switching unit 20 reduces or prevents current flow between voltage source 10 and load circuit 12.

In some examples, switching unit 20 may include a pass through device. In some examples, switching unit 20 may include a Field Effect Transistor (FET). Examples of FETs may include, but are not limited to, junction field-effect transistor (JFET), MOSFET, dual-gate MOSFET, insulated-gate bipolar transistor (IGBT), any other type of FET, or any combination of the same. Examples of MOSFETS may include, but are not limited to, PMOS, NMOS, DMOS, or any other type of MOSFET, or any combination of the same.

In some examples, one or more components of reverse current protection system 1 may be configured to operate with current 18 flowing from voltage source 10 to load circuit 12. For instance, voltage source 10 may be a battery configured to supply power to a light emitting diode of load circuit 12. However, in some examples, one or more components of reverse current protection system 1 may be damaged when a reverse current flows from load circuit 12 to voltage source 10. For instance, load circuit 12 may include a capacitor bank that may supply a current capable of damaging integrated circuit 14 when a voltage of the capacitor bank is greater than a voltage of voltage source 10. Accordingly, in some examples, reverse current protection unit 22 may be configured to reduce a current flow from load circuit 12 to voltage source 10.

In some examples, reverse current protection unit 22 may be configured to switch a body of switching unit 20 to a highest potential in order to reduce or prevent reverse current. For instance, reverse current protection unit 22 may be configured to selectively couple voltage rail 32 to the body of switching unit 20. In some instances, reverse current protection unit 22 may be configured to selectively couple output node 34 to the body of switching unit 20. In some examples, reverse current protection unit 22 may selectively couple the body of switching unit 20 based on a voltage of reverse current protection system 1. For instance, reverse current protection unit 22 may be configured to couple output node 34 to the body of switching unit 20 in response to a voltage of output node 34 being greater than a voltage of voltage rail 32 and a voltage of ground rail 36. In some instances, reverse current protection unit 22 may be configured to couple voltage rail 32 to the body of switching unit 20 in response to a voltage of voltage rail 32 being greater than a voltage of output node 34 and a voltage of ground rail 36.

In some examples, reverse current protection unit 22 may be configured to permit ground rail 36 to shift in voltage, for example, to support automotive applications. For instance, ground rail 36 may have a shift in voltage of ~2 VDC. In some examples, reverse current protection unit 22 may be configured to selectively couple the body of switching unit 20 to a highest potential of voltage rail 32, output node 34, and ground rail 36 in order to reduce or prevent reverse current. For instance, reverse current protection unit 22 may be configured to couple the body of switching unit 20 to ground rail 36 in response to a voltage of ground rail 36 being greater than a voltage of voltage rail 32 and the voltage of voltage rail 32 being greater than a voltage of output node 34.

In some examples, reverse current protection unit 22 may include a bipolar junction transistor (BJT). Examples of BJTs may include, but are not limited to, PNP, NPN, heterojunction, or any other type of BJT, or any combination of the same. In some examples, reverse current protection unit 22 may include a resistive element. For instance, reverse current protection unit 22 may include a resistor selected to drive a particular range of current to the body of switching unit 20 such that switching unit 20 may switch at a desirable switching speed while limiting a quiescent current of reverse current protection unit 22.

In some examples, driver unit 24 may be configured to receive an input signal on input node 30 of integrated circuit 14 and to generate a control signal in response to the input signal received on input node 30. For instance, driver unit 24 may be configured to receive an input signal (e.g., a logical '0') on input node 30 indicating an instruction to operate switching unit 20 in a closed state and, in response to the instruction, driver unit 24 may generate a control signal (e.g., a logical '0') to operate switching unit 20 in the closed state.

In some examples, driver unit 24 may be configured to cause switching unit 20 to operate in an open state to prevent a reverse current from flowing through a pass device of switching unit 20. In some examples, driver unit 24 may be configured to generate the control signal based on a comparison of a voltage of load circuit 12 and voltage source 10. For instance, driver unit 24 may be configured to, using a comparator, compare a voltage of voltage rail 32 with a voltage of output node 34 and to generate a control signal to operate switching unit 20 in an open state when the voltage of voltage rail 32 is less than the voltage of output node 34. As such, driver unit 24 may prevent a reverse current from flowing from load circuit 12 through switching unit 20 to voltage rail 32. In some examples, driver unit 24 may be configured to generate the control signal based on a difference in voltages of voltage rail 32 and ground rail 36. For instance, driver unit 24 may be configured to, using a diode, generate a control signal to operate switching unit 20 in an open state when the voltage of voltage rail 32 is less than the voltage of ground rail 36. As such, driver unit 24 may prevent a reverse current from flowing from ground rail 36 through switching unit 20 to voltage rail 32.

In some examples, driver unit 24 may be configured to generate the control signal based on a combination of factors. In some examples, driver unit 24 may be configured to generate the control signal based on a comparison of the voltage of load circuit 12 and voltage source 10, a difference between a voltage of voltage rail 32 and ground rail 36, and a received input signal. For instance, driver unit 24 may be configured to generate a control signal to operate switching unit 20 in the open state when the voltage of voltage rail 32 is less than the voltage of ground rail 36, when the voltage of voltage rail 32 is less than the voltage of output node 34, or when an input signal received on input node 30 indicates instructions to operate switching unit 20 in an open state.

In some examples, driver unit 24 may include Field Effect Transistor (FET). In some examples, switching unit 20 may include a bipolar junction transistor (BJT). In some examples, driver unit 24 may include a comparator. In some examples, driver unit 24 may include a resistive element. For instance, driver unit 24 may include a pull-up resistor. In some embodiments, driver unit 24 may include a diode.

In some examples, electrostatic discharge protection unit 26 may be configured to discharge current from output node 34 onto ground rail 36 to protect integrated circuit 14 from damage. In some examples, electrostatic discharge protection unit 26 may be configured to discharge a current from output node 34 onto ground rail 36 using an electrostatic discharge (ESD) element. Examples of ESD elements may include, but are not limited to, transient-voltage-suppression diode, avalanche diode, clamping devices, Zener diode, transient voltage suppressors, Schottky diode, or any other type of ESD element, or any combination of the same.

In some examples, electrostatic discharge protection unit 26 may be configured to output a highest potential of load circuit 12. For instance, electrostatic discharge protection unit 26 may be configured to output on a node of electrostatic discharge protection unit 26 a voltage of output node 34 when the voltage of output node 34 is greater than a voltage of ground rail 36 and to output a voltage of ground rail 36 when the voltage of ground rail 36 is greater than the voltage of output node 34 using ESD elements.

In some examples, microcontroller 16 may be configured to control switching unit 20 to permit power to flow from voltage source 10 to load circuit 12. In some examples, microcontroller 16 may be a single integrated circuit (SoC) that is separate from integrated circuit 14. In some examples, microcontroller 16 and integrated circuit 14 may form a single integrated circuit. Microcontroller 16 may be configured to output a signal that controls the operation of integrated circuit 14. In some examples, microcontroller 16 may output a pulse width modulation signal that causes a switching unit of integrated circuit 14 to operate in a closed state (e.g., when the signal is low) and an open state (e.g., when the signal is high). In some examples, the signal output by microcontroller 16 may have a switching frequency. In some examples, the switching frequency of the signal may correspond to how often a switching unit of integrated circuit 14 switches. In some examples, the switching frequency may be in the kilohertz range. For instance, the signal may have a switching frequency between 4 KHz and 20 KHz. In some examples, the signal output by microcontroller 16 may have a duty cycle which may correspond to the ratio of time the signal is high vs. low. In some examples, microcontroller 16 may be configured to set the duty cycle and/or the switching frequency of the signal based on information received.

Figure 2:
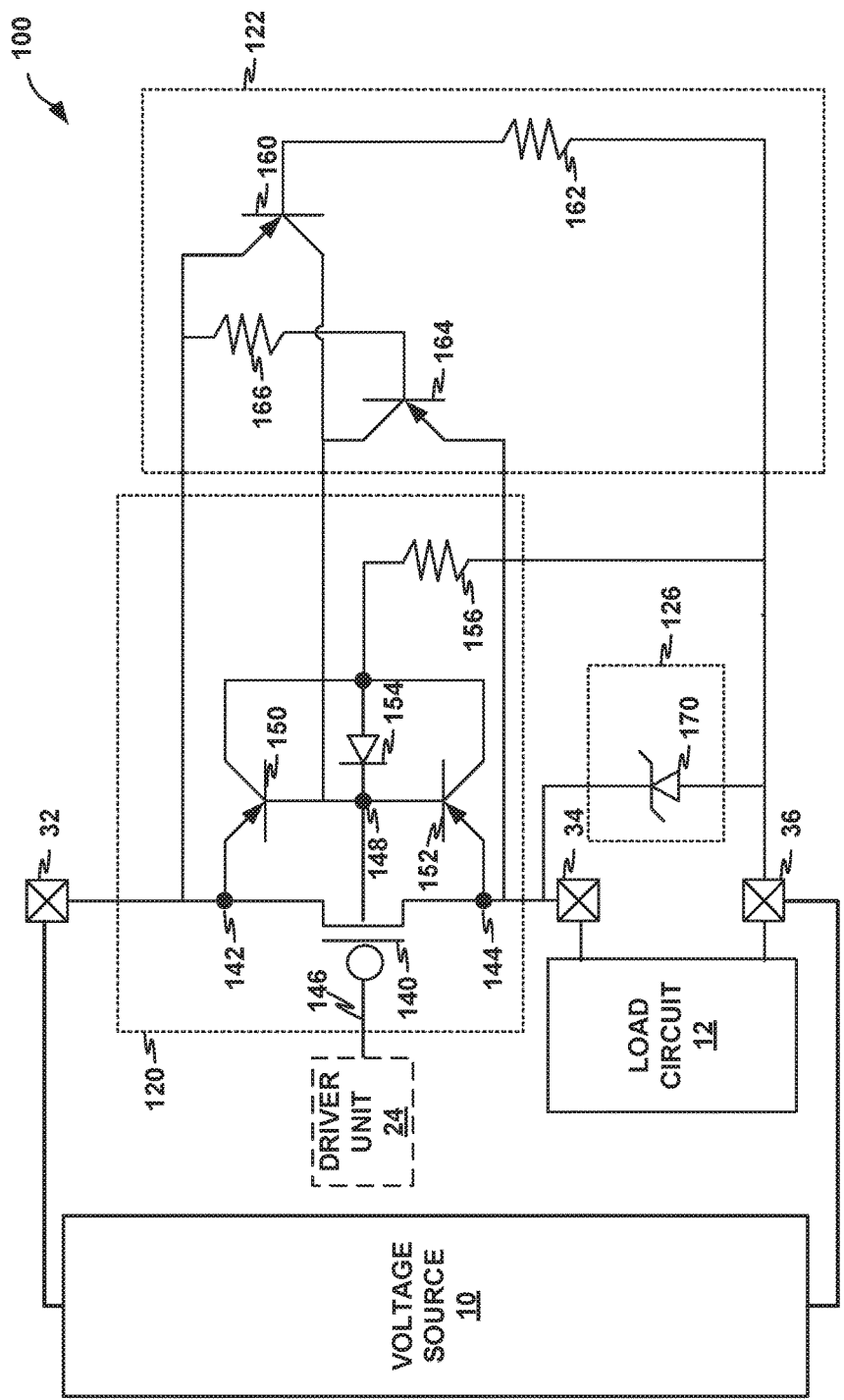
FIG. 2 is a circuit diagram illustrating an example integrated circuit including a switching unit, reverse current protection unit, and electrostatic discharge protection unit, in accordance with one or more techniques of this disclosure.

FIG. 2 is a circuit diagram illustrating an example integrated circuit 100 including switching unit 120, reverse current protection unit 122, and electrostatic discharge protection unit 126, in accordance with one or more techniques of this disclosure. FIG. 2 is described below within the context of reverse current protection system 1 of FIG. 1. However, the techniques described below can be used in any permutation, and in any combination, with voltage source 10, load circuit 12, integrated circuit 14, and microcontroller 16 to prevent or reduce damage from occurring as a result of reverse current.

In the example of FIG. 2, integrated circuit 100 includes voltage source 10, load circuit 12, driver unit 24, voltage rail 32, output node 34, and ground rail 36 as described in FIG. 1. In the example of FIG. 2, integrated circuit 100 includes switching unit 120, which may include voltage controlled circuit element 140. Although, a MOSFET symbol is shown in FIG. 2 as voltage controlled circuit element 140, any electrical device that is controlled by a voltage may be used in place of the MOSFET as described in FIG. 1. Switching unit 120 may also include first node 142 (e.g., a source), second node 144 (e.g., a drain), control node 146 (e.g., a gate), and body 148. In some examples, control node 146 may be coupled to driver unit 24 to receive a control signal generated by driver unit 24.

In some examples, fabricating switching unit 120 may result in parasitic elements. For instance, switching unit 120 may include substrate PNP transistor 150, substrate PNP transistor 152, substrate diode 154, and substrate resistance 156. In some examples, a current may flow from second node 144 through the parasitic elements to first node 142, which may damage switching unit 120. For instance, a current may flow from second node 144 through substrate PNP transistors 150 and 152 to first node 142. In some instances, a current may flow from ground rail 36 through substrate resistance 156, substrate PNP transistors 150 and 152, and substrate diode 154 to first node 142.

In the example of FIG. 2, integrated circuit 100 includes reverse current protection unit 122, which may include first voltage controlled circuit element 160, first resistive element 162, second voltage controlled circuit element 164, and second resistive element 166. Although, a PNP symbol is shown in FIG. 2 as first voltage controlled circuit element 160 and as second voltage controlled circuit element 164, any electrical device that is controlled by a voltage may be used in place of the BJT as described in FIG. 1. In some examples, first voltage controlled circuit element 160 includes an emitter coupled to first node 142, a collector coupled to body 148, and a base coupled to a first node of first resistive element 162. In some examples, first resistive element 162 may have a resistance level (e.g., ohms) selected to limit the current needed to drive first voltage controlled circuit element 160 and may further include a second node coupled to ground rail 36. In some examples, second voltage controlled circuit element 164 includes an emitter coupled to second node 144, a collector coupled to body 148, and a base coupled to a second node of second resistive element 166. In some examples, second resistive element 166 may have a resistance level (e.g., ohms) selected to limit the current needed to drive second voltage controlled circuit element 164 and may further include a first node coupled to voltage rail 32.

In some examples, reverse current protection unit 122 may couple body 148 to a highest potential of voltage rail 32 and output node 34. For instance, during a normal operation when a voltage of voltage rail 32 is greater than a voltage of ground rail 36 plus a voltage (e.g., $V_{BE}$) across first voltage controlled circuit element 160, first voltage controlled circuit element 160 may couple voltage rail 32 to body 148 such that a voltage of body 148 is equal to a voltage of voltage rail 32 minus a saturation voltage (e.g., $V_{CE\_SAT}$) of first voltage controlled circuit element 160. In some instances, during a reverse voltage operation when a voltage of voltage rail 32 is less than a voltage of output node 34, second voltage controlled circuit element 164 may couple output node 34 to body 148 such that a voltage of body 148 is equal to a voltage of output node 34 minus a saturation voltage (e.g., $V_{CE\_SAT}$) of second voltage controlled circuit element 164. In some instances, during a high ground voltage operation when a voltage of ground rail 36 is higher than a voltage of output node 34 and greater than zero volts, second voltage controlled circuit element 164 may couple output node 34 to body 148 such that a voltage of body 148 is equal to a voltage of output node 34 minus a saturation voltage (e.g., $V_{CE\_SAT}$) of second voltage controlled circuit element 164.

In some examples, reverse current protection unit 122 may be configured to permit a switching operational mode, for example, to allow pulse width modulation switching of a load of light emitting diodes connected in parallel to one or more capacitor elements or during micro-interruption of voltage source 10 (e.g., a short spike lasting microseconds where a voltage output drops to ~0 VDC). For instance, during a switching operation when a voltage of output node 34 is greater than a voltage of voltage rail 34, second voltage controlled circuit element 160 may couple output node 34 to body 148 such that a voltage of body 148 is equal to a voltage of output node 34 minus a saturation voltage (e.g., VCE_SAT) of second voltage controlled circuit element 160, thereby preventing a current flow from output node 34 to voltage rail 32.

In the example of FIG. 2, integrated circuit 100 includes electrostatic discharge protection unit 126, which may include ESD 170. In some examples, ESD 170 may include a first node (e.g., a cathode) coupled to output node 34 and a second node (e.g., an anode) coupled to ground rail 36. In some examples, ESD 170 may be selected to discharge a current received at output node 34 to ground rail 36. For instance, ESD 170 may be configured to operate in a closed state if a voltage at output node 34 exceeds a maximum voltage of switching unit 120.

Figure 3:
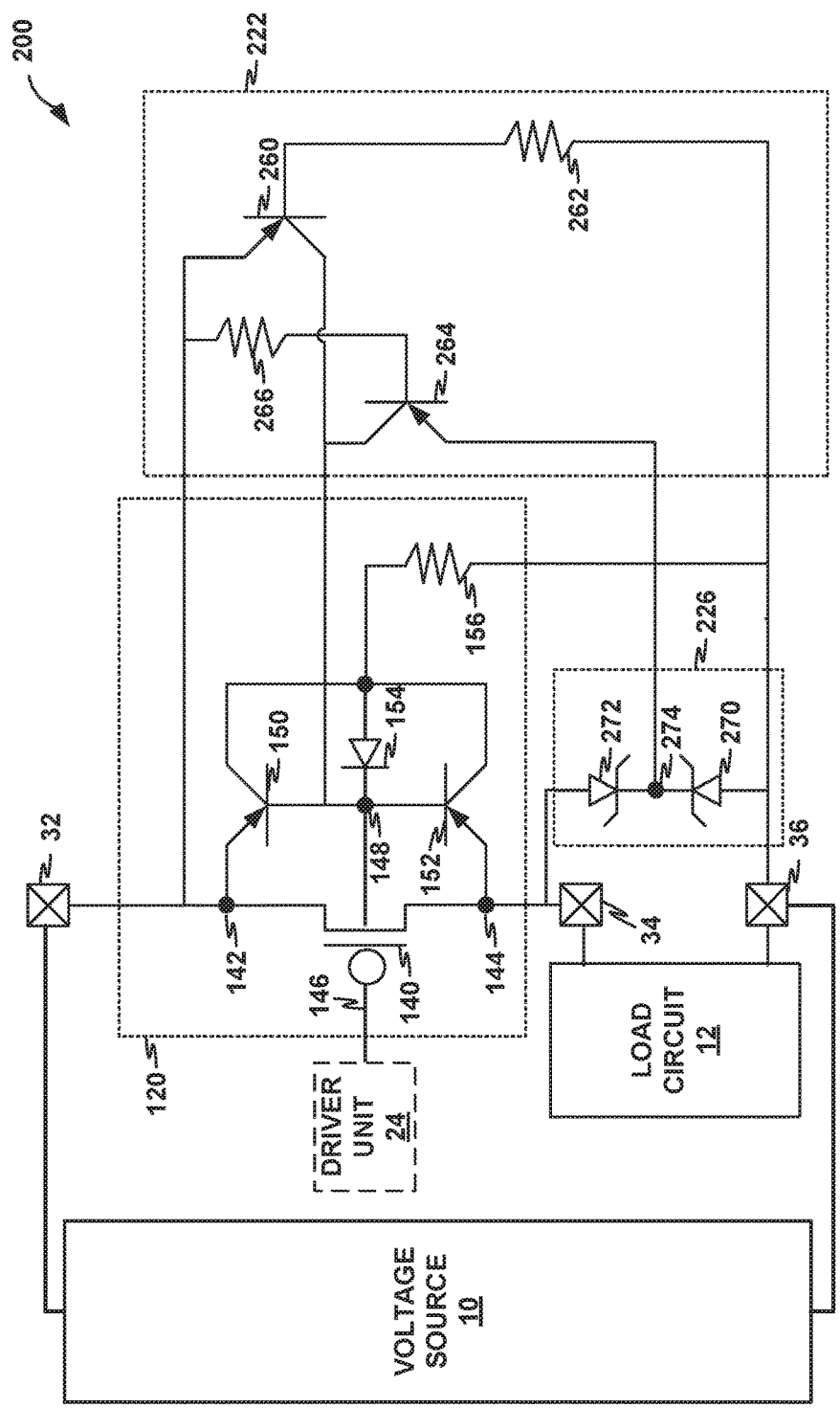
FIG. 3 is a circuit diagram illustrating another example integrated circuit including a switching unit, reverse current protection unit, and electrostatic discharge protection unit, in accordance with one or more techniques of this disclosure.

FIG. 3 is a circuit diagram illustrating another example integrated circuit 200 including switching unit 120, reverse current protection unit 222, and electrostatic discharge protection unit 226, in accordance with one or more techniques of this disclosure. FIG. 3 is described below within the context of reverse current protection system 1 of FIG. 1. However, the techniques described below can be used in any permutation, and in any combination, with voltage source 10, load circuit 12, integrated circuit 14, and microcontroller 16 to prevent or reduce damage from occurring as a result of reverse current.

In the example of FIG. 3, circuit 200 includes voltage source 10, load circuit 12, driver unit 24, voltage rail 32, output node 34, and ground rail 36 as described in FIG. 1. In the example of FIG. 3, circuit 200 includes switching unit 120 as described in FIG. 2. In the example of FIG. 3, circuit 200 includes electrostatic discharge protection unit 226, which may include ESD 270 and ESD 272. In some examples, ESD 270 may include a first node (e.g., cathode) coupled to a second node (e.g., cathode) of ESD 272. In some examples, ESD 270 may include a second node (e.g., anode) coupled to ground rail 36. In some examples, ESD 272 may include a first node (e.g., anode) coupled to output node 34. In some examples, ESD 270 may be selected to discharge a current received at output node 34 to ground rail 36. For instance, ESD 270 may be configured to operate in a closed state if a voltage at output node 34 exceeds a maximum voltage of switching unit 120. In some examples, electrostatic discharge protection unit 226 may be configured to output on node 274 of electrostatic discharge protection unit 226 a voltage of output node 34 when the voltage of output node 34 is greater than a voltage of ground rail 36 and to output a voltage of ground rail 36 when the voltage of ground rail 36 is greater than the voltage of output node 34. For instance, when a voltage of ground rail 36 is greater than a voltage of output node 34, ESD 270 may allow current to flow from ground rail 36 to node 274 while ESD 272 may reduce or prevent the current from flowing from node 274 to output node 34.

In the example of FIG. 3, circuit 200 includes reverse current protection unit 222, which may include first voltage controlled circuit element 260, first resistive element 262, second voltage controlled circuit element 264, and second resistive element 266. Although, a PNP symbol is shown in FIG. 3 as first voltage controlled circuit element 260 and as second voltage controlled circuit element 264, any electrical device that is controlled by a voltage may be used in place of the MOSFET as described in FIG. 3. In some examples, first voltage controlled circuit element 260 includes an emitter coupled to first node 142, a collector coupled to body 148, and a base coupled to a first node of first resistive element 262. In some examples, first resistive element 262 may further include a second node coupled to ground rail 36. In some examples, second voltage controlled circuit element 264 includes an emitter coupled to node 274 of electrostatic discharge protection unit 226, a collector coupled to body 148, and a base coupled to a second node of second resistive element 266. In some examples, second resistive element 266 may further include a first node coupled to voltage rail 32.

In some examples, reverse current protection unit 222 may permit ground shifts, thereby allowing further applications (e.g., automotive) by switching body 148 of the switching unit to a highest potential of voltage rail 32, output node 34, and ground rail 36. For instance, second voltage controlled circuit element 264 may couple node 274 of electrostatic discharge protection unit 226 to body 148 when a voltage of ground rail 36 is greater than both a voltage of output node 34 and a voltage of voltage rail 32 such that a voltage of body 148 is equal to a voltage of ground rail 36 minus a saturation voltage (e.g., $V_{CE\_SAT}$) of second voltage controlled circuit element 264 and minus a forward voltage (e.g., $V_{BE}$) of ESD 270.

Figure 4:
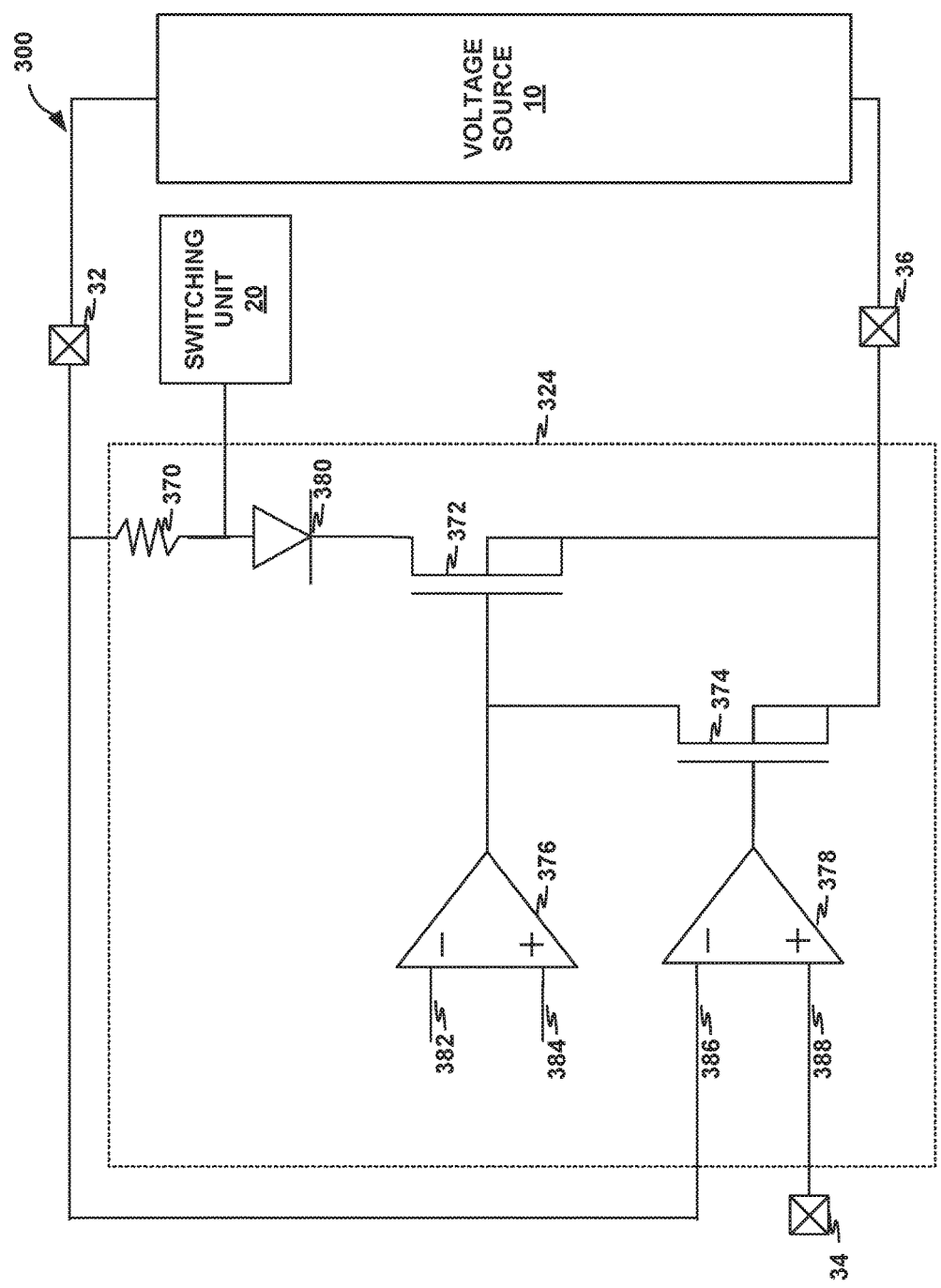
FIG. 4 is a circuit diagram illustrating an example driver unit, in accordance with one or more techniques of this disclosure.

FIG. 4 is a circuit diagram illustrating an example driver unit 324, in accordance with one or more techniques of this disclosure. FIG. 4 is described below within the context of reverse current protection system 1 of FIG. 1. However, the techniques described below can be used in any permutation, and in any combination, with voltage source 10, load circuit 12, integrated circuit 14, and microcontroller 16 to prevent or reduce damage from occurring as a result of reverse current.

In the example of FIG. 4, circuit 300 may include voltage source 10, switching unit 20, voltage rail 32, output node 34, and ground rail 36 as described in FIG. 1. In the example of FIG. 4, circuit 300 may include driver unit 324. In some examples, driver unit 324 may include pull up resistor 370, first voltage controlled circuit element 372, second voltage controlled circuit element 374, first comparator 376, second comparator 378, and diode 380. Although, a NMOS symbol is shown in FIG. 4 as voltage controlled circuit elements 372 and 374, any electrical device that is controlled by a voltage may be used in place of the NMOS as described in FIG. 1.

In some examples, first voltage controlled circuit element 372 may include a source coupled to ground rail 36, a drain coupled to a first node (e.g., cathode) of diode 380, and a gate coupled to an output of comparator 376. In some examples, first voltage controlled circuit element 372 may generate a control signal for switching unit 20. For instance, when first voltage controlled circuit element 372 is operating in a closed state, first voltage controlled circuit element 372 may generate a control signal using a voltage of ground rail 36, which may drive switching unit to operating in a closed state. In some instances, when first voltage controlled circuit element 372 is operating in an open state, first voltage controlled circuit element 372 may generate a control signal using a voltage of voltage rail 32, which may drive switching unit to operating in an open state.

In some examples, driver unit 324 may be configured to receive an input signal on an input node and to generate the control signal in response to the input signal received on the input node. For instance, comparator 376 may compare an input signal received at a first input node 382 (e.g., negative input) with a reference voltage received at a second input node 384 (e.g., positive input), and comparator 376 may drive first voltage controlled circuit element 372 to generate the control signal in response to the comparison.

In some examples, driver unit 324 may generate the control signal to operate switching unit 20 in an open state when the voltage of output node 34 is greater than the voltage of voltage rail 32. For instance, comparator 378 may compare a voltage of voltage rail 32 received at a first input node 386 (e.g., negative input) with a voltage of output node 34 received at a second input node 388 (e.g., positive input), and comparator 378 may drive second voltage controlled circuit element 374 to operate in a closed state, which drives first voltage controlled circuit element 372 to generate a control signal which drives switching unit 20 to operate in an open state. In some examples, second voltage controlled circuit element 374 may include a source coupled to ground rail 36, drain coupled to an output of comparator 376 and a gate of first voltage controlled circuit element 372, and gate coupled to an output of comparator 378.

In some examples, driver unit 324 may generate the control signal to operate switching unit 20 in an open state when the voltage of ground rail 36 is greater than the voltage of voltage rail 32. For instance, diode 380 may reduce a current flowing through pull up resistor 370, thereby preventing switching unit 20 from operating in a closed state. As shown in FIG. 4, pull up resistor 370 may include a first node coupled to voltage rail 32 and a second node coupled to the input node of switching unit 20 and a first node (e.g., anode) of diode 380. In some examples, diode 380 may include a second node (e.g., cathode) coupled to a drain of first voltage controlled circuit element 372.

Figure 5:
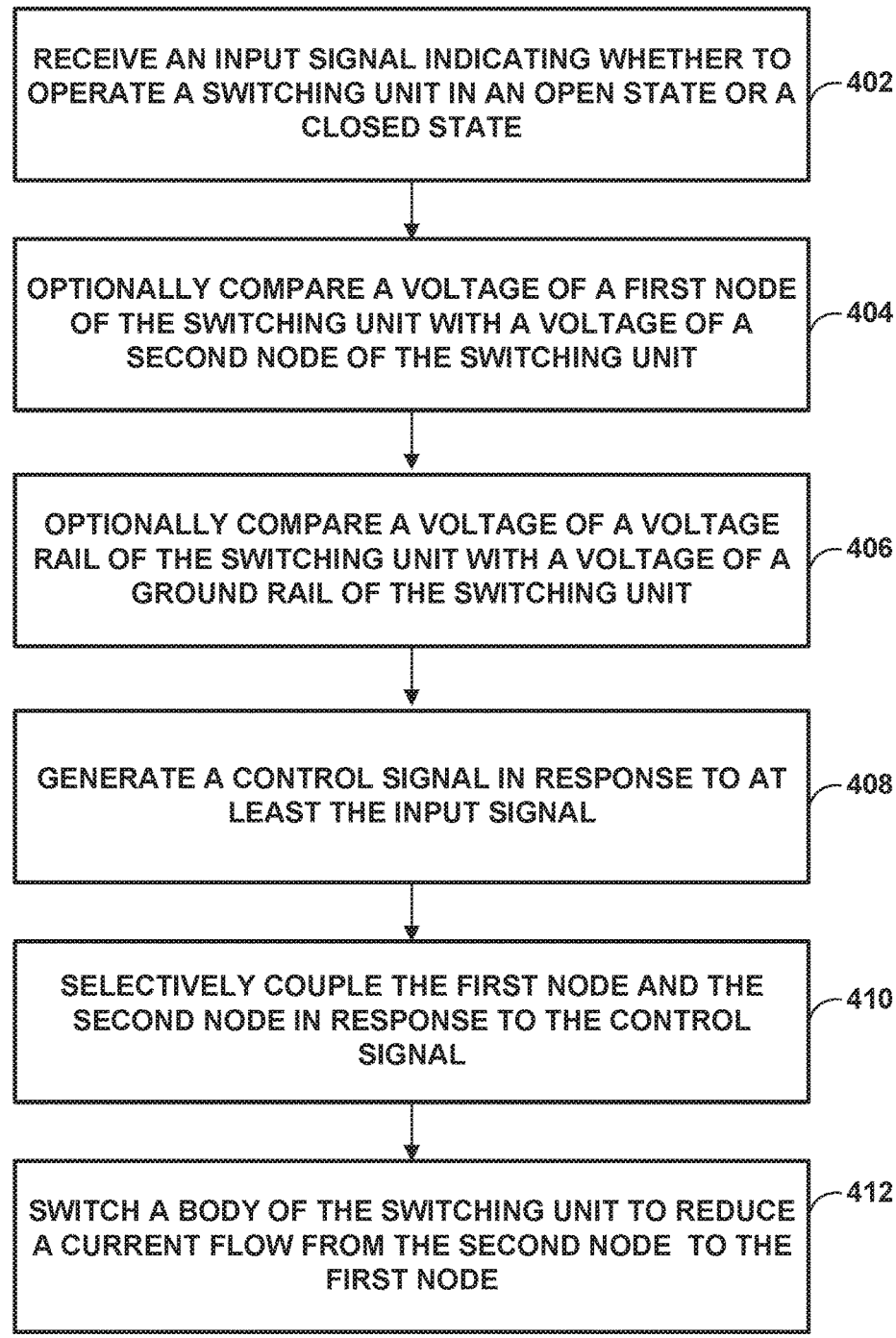
FIG. 5 is a flow diagram consistent with techniques that may be performed by a circuit in accordance with this disclosure.

FIG. 5 is a flow diagram consistent with techniques that may be performed by a circuit in accordance with this disclosure. For purposes of illustration only, the example operations are described below within the context of reverse current protection system 1, as shown in FIG. 1. However, the techniques described below can be used in any permutation, and in any combination, with voltage source 10, load circuit 12, integrated circuit 14, and microcontroller 16 to prevent or reduce damage from occurring as a result of reverse current.

In accordance with one or more techniques of this disclosure, driver unit 24 of reverse current protection system 1 may receive, using one or more active circuit elements, an input signal indicating whether to operate a switching unit in an open state or a closed state (402). In some examples, the one or more active circuit elements may include comparators, such as comparator 376 of FIG. 4. In some examples, the input signal may be compared with a reference voltage. For instance, comparator 376 of FIG. 4 may compare an input signal received at a first input node 382 (e.g., negative input) with a reference voltage received at a second input node 384 (e.g., positive input).

As shown in FIG. 5, driver unit 24 may, using one or more active circuit elements, optionally compare a voltage of a first node of switching unit 20 with a voltage of a second node of switching unit 20 (404). In some examples, the one or more active circuit elements may include comparators, such as comparator 378 of FIG. 4. For instance, comparator 378 may compare a voltage of the first node of switching unit 20 received at first input node 386 (e.g., negative input) with a voltage of the second node of switching unit 20 received at a second input node 388 (e.g., positive input).

Driver unit 24 may, using one or more active circuit elements, optionally compare a voltage of voltage rail 32 of switching unit 20 with a voltage of ground rail 36 of switching unit 20 (406). In some examples, the one or more active circuit elements may include diodes, such as diode 380 of FIG. 4. For instance, diode 380 may prevent switching unit 20 from operating in a close state when ground rail 36 has a voltage that is greater than a voltage of voltage rail 32.

Driver unit 24 of reverse current protection system 1 may generate, using one or more active circuit elements, a control signal in response to the input signal (408). In some examples, the one or more active circuit elements may include comparators, such as comparator 376 of FIG. 4 and voltage controlled circuit elements, such as voltage controlled circuit element 372 of FIG. 4. In some examples, driver unit 24 may drive first voltage controlled circuit element 372 to generate the control signal in response to the output of comparator 376. For instance, comparator 378, diode 380, and second voltage controlled circuit element 374 may be omitted and comparator 376 may drive first voltage controlled circuit element 372 to generate a control signal which drives switching unit 20 to operate in an open state or to operate in a closed state. In some examples, driver unit 24 of reverse current protection system 1 may generate, using one or more active circuit elements, a control signal in response to the input signal and further in response to a comparison of the voltages of the first and second nodes of switching unit 20 and/or a comparison of the voltages of the ground rail 36 and voltage rail 32. In some examples, the one or more active circuit elements may include comparators, such as comparators 376 and 378 of FIG. 4, voltage controlled circuit elements, such as voltage controlled circuit elements 372 and 374 of FIG. 4, and diodes, such as diode 380 of FIG. 4. For example, driver unit 24 may generate the control signal in response to the output of comparator 376 and/or the output of comparator 378. For instance, comparator 378 and second voltage controlled circuit element 374 may drive first voltage controlled circuit element 372 to generate a control signal which drives switching unit 20 to operate in an open state when the voltage of output node 34 is greater than the voltage of voltage rail 32. In some examples, driver unit 24 may generate the control signal in response to an operation of diode 380. For instance, diode 380 may drive first voltage controlled circuit element 372 to generate a control signal which drives switching unit 20 to operate in an open state when a voltage of ground rail 36 is greater than a voltage of voltage rail 32.

Switching unit 20 of reverse current protection system 1 may selectively couple, using one or more active circuit elements, the first node and the second node in response to the control signal (410). In some examples, the one or more active circuit elements may include voltage controlled circuit elements, such as voltage controlled circuit element 140 of FIGS. 2-3, 6. In some examples, the one or more active circuit elements may include parasitic elements including voltage controlled circuit elements, such as PNP transistors 150 and 152 of FIGS. 2-3, diodes, such as substrate diode 154 of FIGS. 2-3, 6, and resistive elements, such substrate resistance 156 of FIGS. 2-3, 6. In some examples, switching unit 20 may, in response to the control signal, change between operating in an open state and operating in a closed state to selectively couple the first node and the second node of switching unit 20. For instance, in response to receiving a control signal on control node 146 driving a voltage at control node 146 to a voltage of voltage rail 32, voltage controlled circuit element 140 may operate in the open state.

Reverse current protection unit 22 of reverse current protection system 1 may switch, using one or more active circuit elements and/or one or more passive circuit elements, a body of switching unit 20 to reduce a parasitic current flow from the second node of switching unit 20 to the first node of switching unit 20 (412).

In some examples, the one or more active circuit elements used to switch the body of switching unit 20 to reduce a parasitic current flow from the second node of switching unit 20 to the first node of switching unit 20 may include voltage controlled circuit elements, such as voltage controlled circuit elements 160 and 164 of FIG. 2 and the one or more passive circuit elements may include resistive elements, such as resistive elements 162 and 166 of FIG. 2. For instance, voltage controlled circuit element 160 couples voltage rail 32 to body 148 when a voltage of voltage rail 32 is greater than a voltage of output node 34 and voltage controlled circuit element 164 couples output node 34 to body 148 when the voltage of voltage rail 32 is less than the voltage of output node 34.

In some examples, the one or more active circuit elements used to switch the body of switching unit 20 to reduce a parasitic current flow from the second node of switching unit 20 to the first node of switching unit 20 may include voltage controlled circuit elements, such as voltage controlled circuit elements 260 and 264 of FIG. 3 and the one or more passive circuit elements may include resistive elements, such as resistive elements 262 and 266 of FIG. 3. For instance, voltage controlled circuit element 260 couples voltage rail 32 to body 148 when a voltage of voltage rail 32 is greater than a voltage of node 274 and voltage controlled circuit element 264 couples node 274 to body 148 when the voltage of voltage rail 32 is less than the voltage of output node 34. In some examples, a voltage of node 274 may be output by electrostatic discharge protection unit 226. For instance, ESD 272 of FIG. 3 may permit node 274 to have a voltage of second node 144 when the voltage of second node 144 is greater than a voltage of ground rail 36 and ESD 270 of FIG. 3 may permit node 274 to have a voltage of ground rail 36 when the voltage of second node 144 is less than a voltage of ground rail 36.

Figure 6:
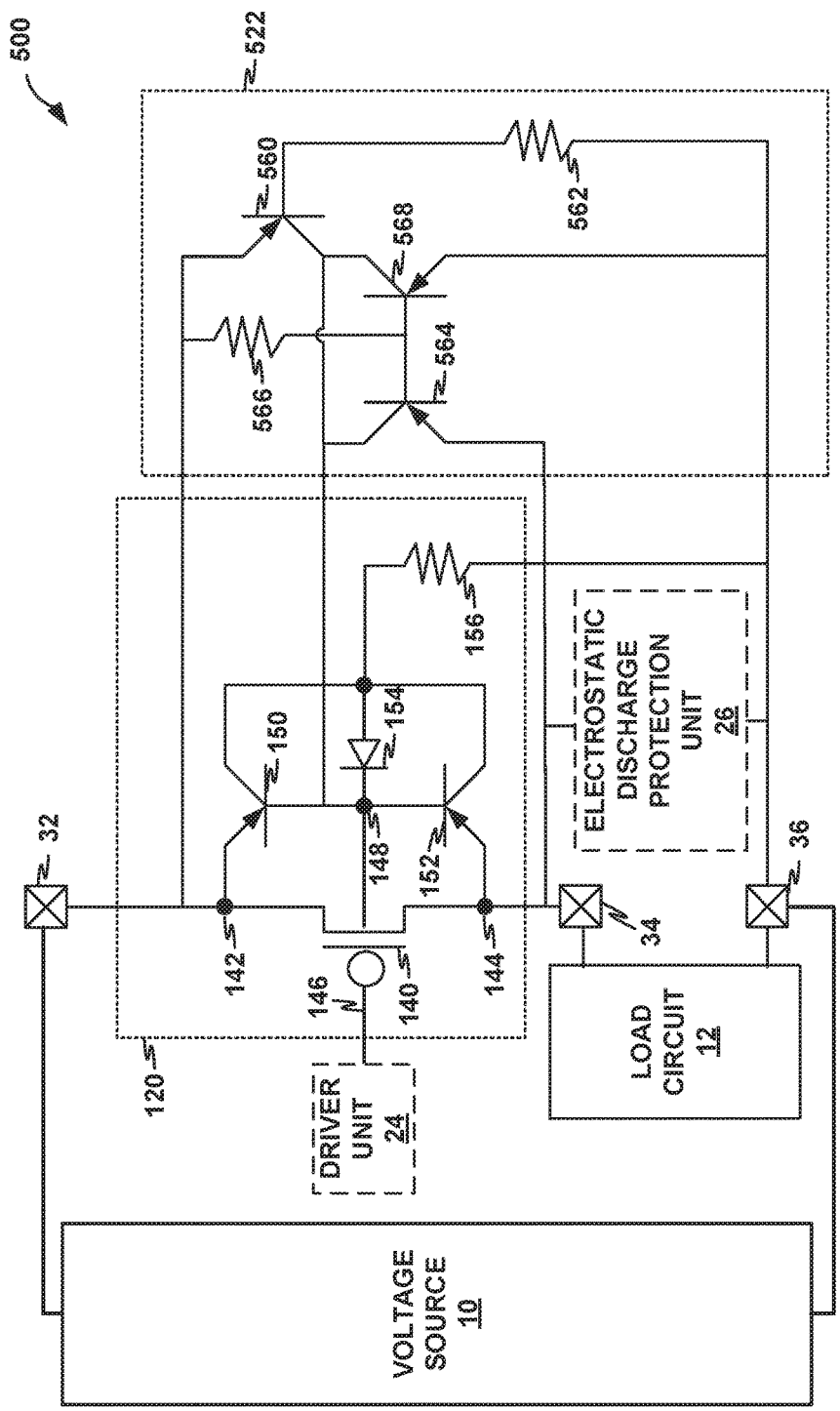
FIG. 6 is a circuit diagram illustrating another example integrated circuit including a switching unit and reverse current protection unit, in accordance with one or more techniques of this disclosure.

As discussed further with respect to FIG. 6, in some examples, the one or more active circuit elements used to switch the body of switching unit 20 to reduce a parasitic current flow from the second node of switching unit 20 to the first node of switching unit 20 may include voltage controlled circuit elements, such as voltage controlled circuit elements 560, 564, and 568 of FIG. 6 and the one or more passive circuit elements may include resistive elements, such as resistive elements 562 and 566 of FIG. 6. For instance, voltage controlled circuit element 568 couples ground rail 36 to body 148 when a voltage of ground rail 36 is greater than a voltage of voltage rail 32.

FIG. 6 is a circuit diagram illustrating another example integrated circuit 500 including switching unit 120 and reverse current protection unit 522, in accordance with one or more techniques of this disclosure. FIG. 6 is described below within the context of reverse current protection system 1 of FIG. 1. However, the techniques described below can be used in any permutation, and in any combination, with voltage source 10, load circuit 12, integrated circuit 14, and microcontroller 16 to prevent or reduce damage from occurring as a result of reverse current.

In the example of FIG. 6, circuit 500 includes voltage source 10, load circuit 12, voltage rail 32, output node 34, and ground rail 36 as described in FIG. 1. Circuit 500 may optionally include driver unit 24 and/or electrostatic discharge protection unit 26 as described in FIG. 1. For example, circuit 500 may include electrostatic discharge protection unit 126 as described in FIG. 2. In the example of FIG. 6, circuit 500 includes switching unit 120 as described in FIG. 2.

In the example of FIG. 6, circuit 500 includes reverse current protection unit 522, which may include first voltage controlled circuit element 560, first resistive element 562, second voltage controlled circuit element 564, second resistive element 566, and third voltage controlled circuit element 568. Although, a PNP symbol is shown in FIG. 6 as first voltage controlled circuit element 560, as second voltage controlled circuit element 564, and as third voltage controlled circuit element 568, any electrical device that is controlled by a voltage may be used in place of the MOSFET as described in FIG. 6. In some examples, first voltage controlled circuit element 560 includes an emitter coupled to first node 142, a collector coupled to body 148, and a base coupled to a first node of first resistive element 562. In some examples, first resistive element 562 may further include a second node coupled to ground rail 36. In some examples, second voltage controlled circuit element 564 includes an emitter coupled to second node 144, a collector coupled to body 148, and a base coupled to a second node of second resistive element 566. In some examples, second resistive element 566 may further include a first node coupled to voltage rail 32. In some examples, third voltage controlled circuit element 568 includes an emitter coupled to ground rail 36, a collector coupled to body 148, and a base coupled to the second node of second resistive element 566.

In some examples, reverse current protection unit 522 may couple body 148 to a highest potential of voltage rail 32, output node 34, and ground rail 36. For instance, during a normal operation when a voltage of voltage rail 32 is greater than a voltage of ground rail 36 plus a voltage (e.g., $V_{BE}$) across first voltage controlled circuit element 560, first voltage controlled circuit element 560 may couple voltage rail 32 to body 148 such that a voltage of body 148 is equal to a voltage of voltage rail 32 minus a saturation voltage (e.g., $V_{CE\_SAT}$) of first voltage controlled circuit element 560. In some instances, during a micro interruption of voltage source 10 when a voltage of output node 34 is greater than a voltage of voltage rail 32 plus a voltage (e.g., $V_{BE}$) across second voltage controlled circuit element 564, second voltage controlled circuit element 564 may couple output node 34 to body 148 such that a voltage of body 148 is equal to a voltage of output node 34 minus a saturation voltage (e.g., $V_{CE\_SAT}$) of second voltage controlled circuit element 564. In some instances, during a reverse polarity operation when a voltage of ground rail 36 is greater than a voltage of output node 34, which is greater than a voltage of voltage rail 32, third voltage controlled circuit element 568 may couple ground rail 36 to body 148 such that a voltage of body 148 is equal to a voltage of ground rail 36 minus a saturation voltage (e.g., $V_{CE\_SAT}$) of third voltage controlled circuit element 568. In this manner, reverse current protection unit 522 may prevent parasitic current flow in switching unit 120.

The following examples may illustrate one or more aspects of the disclosure.

EXAMPLE 1

A circuit comprising: a switching unit comprising a first node, a second node, a control node, and a body, wherein the switching unit is configured to selectively couple the first node of the switching unit and the second node of the switching unit in response to receiving a control signal at a control input of the switching unit; and a reverse current protection unit configured to reduce a current flow from the second node of the switching unit to the first node of the switching unit, wherein the reverse current protection unit selectively couples the first node of the switching unit and a body of the switching unit and selectively couples the second node of the switching unit to the body of the switching unit.

EXAMPLE 2

The circuit of example 1, wherein the reverse current protection unit couples the body of the switching unit and the second node of the switching unit in response to a voltage of the second node of the switching unit being greater than a voltage of the first node of the switching unit.

EXAMPLE 3

The circuit of any combination of examples 1-2, further comprising: a voltage rail coupled to the first node of the switching unit; a ground rail; and a load circuit comprising a first node coupled to the second node of the switching unit and a second node coupled to the ground rail, wherein the reverse current protection unit is configured to reduce a current flow from the load circuit to the voltage rail.

EXAMPLE 4

The circuit of any combination of examples 1-3, wherein the reverse current protection unit comprises: a first resistive element comprising a first node and a second node, the second node of the first resistive element being coupled to the ground rail; and a first transistor comprising an emitter coupled to the voltage rail, a collector coupled to the body of the switching unit, and a base coupled to the first node of the first resistive element.

EXAMPLE 5

The circuit of any combination of examples 1-4, wherein the reverse current protection unit further comprises: a second resistive element comprising a first node coupled to the voltage rail and a second node; and a second transistor comprising an emitter coupled to the first node of the load circuit, a collector coupled to the body of the switching unit, and a base coupled to the second node of the second resistive element.

EXAMPLE 6

The circuit of any combination of examples 1-5, wherein the reverse current protection unit further comprises: a third transistor comprising an emitter coupled to the ground rail, a collector coupled to the body of the switching unit, and a base coupled to the second node of the second resistive element.

EXAMPLE 7

The circuit of any combination of examples 1-6, wherein the reverse current protection unit couples the body of the switching unit and the ground rail in response to a voltage of the ground rail being greater than a voltage of the voltage rail.

EXAMPLE 8

The circuit of any combination of examples 1-7, wherein the switching unit is further configured to operate in a closed state and an open state, wherein during the closed state the switching unit permits current to flow bi-directionally between the first node of the switching unit and the second node of the switching unit and wherein during the open state the switching unit reduces current flow between the first node of the switching unit and the second node of the switching unit.

EXAMPLE 9

The circuit of any combination of examples 1-8, a driver unit configured to generate the control signal received at the control input of the switching unit to cause the switching unit to operate in the open state when a voltage of the first terminal of the load circuit is greater than a voltage of the voltage rail.

EXAMPLE 10

The circuit of any combination of examples 1-9, wherein the driver unit is further configured to generate the control signal received at the control node of the switching unit to cause the switching unit to operate in the open state when a voltage of the ground rail is greater than a voltage of the voltage rail.

EXAMPLE 11

An integrated circuit comprising: a driver unit configured to receive an input signal on an input node of the integrated circuit and to generate a control signal in response to the input signal received on the input node of the integrated circuit; a switching unit comprising a first node coupled to a voltage rail of the integrated circuit, a second node coupled to an output node, and a body, wherein the switching unit is configured to selectively couple the first node of the switching unit and the second node of the switching unit in response to the control signal generated by the driver unit; and a reverse current protection unit configured to reduce a current flow from the second node of the switching unit to the first node of the switching unit, wherein the reverse current protection unit selectively couples the first node of the switching unit to the body of the switching unit and selectively couples the second node of the switching unit to the body of the switching unit.

EXAMPLE 12

The integrated circuit according to claim 11, wherein: the reverse current protection unit selectively couples a ground rail of the integrated circuit to the body of the switching unit.

EXAMPLE 13

The integrated circuit of any combination of examples 11-12, wherein: the reverse current protection unit couples the body of the switching unit and the ground rail in response to a voltage of the ground rail being greater than a voltage of the first node of the switching unit.

EXAMPLE 14

The integrated circuit of any combination of examples 11-13, wherein: the driver unit is configured to compare a voltage of the voltage rail with a voltage of the output node, and the driver unit generates the control signal further in response to the comparison of the voltage of the voltage rail with the voltage of the output node.

EXAMPLE 15

The integrated circuit of any combination of examples 11-14, wherein the driver unit is further configured to generate the control signal received at the control node of the switching unit to cause the switching unit to operate in the open state when a voltage of the ground rail is greater than a voltage of the voltage rail.

EXAMPLE 16

The integrated circuit of any combination of examples 11-15, wherein the driver unit is further configured to generate the control signal received at the control node of the switching unit to cause the switching unit to operate in the open state when a voltage of a ground rail of the integrated circuit is greater than a voltage of the voltage rail.

EXAMPLE 17

A semiconductor device comprising: means for selectively coupling a first node of a switching unit and a second node of the switching unit in response to receiving a control signal; and means for switching a body of the switching unit to reduce a current flow from the second node of the switching unit to the first node of the switching unit.

EXAMPLE 18

The semiconductor device of example 17, comprising: means for generating the control signal.

EXAMPLE 19

The semiconductor device of any combination of examples 17-18, comprising: means for discharging a current from the second node of the switching unit to a ground rail of the semiconductor device.

EXAMPLE 20

The semiconductor device of any combination of examples 17-19, comprising: means for coupling the body of the switching unit and the ground rail in response to a voltage of the ground rail being greater than a voltage of the first node of the switching unit.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure.

Such hardware, software, and firmware may be implemented within the same device or within separate devices to support the various techniques described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware, firmware, or software components. Rather, functionality associated with one or more modules or units may be performed by separate hardware, firmware, or software components, or integrated within common or separate hardware, firmware, or software components.

Various aspects have been described in this disclosure. These and other aspects are within the scope of the following claims.

The invention claimed is:

1. A circuit comprising:
a switching unit comprising a first node, a second node, a control node, and a body, wherein the switching unit is configured to selectively couple the first node of the switching unit and the second node of the switching unit in response to receiving a control signal at the control node of the switching unit, wherein the switching unit is configured to operate in a closed state and an open state, wherein during the closed state the switching unit permits current to flow bi-directionally between the first node of the switching unit and the second node of the switching unit, and wherein during the open state the switching unit reduces current flow between the first node of the switching unit and the second node of the switching unit;
a reverse current protection unit configured to reduce a current flow from the second node of the switching unit to the first node of the switching unit, wherein the reverse current protection unit selectively couples the first node of the switching unit to the body of the switching unit and selectively couples the second node of the switching unit to the body of the switching unit;
an output node coupled to the second node of the switching unit and configured to be coupled to a first node of a load circuit; and
a driver unit configured to generate the control signal received at the control node of the switching unit to cause the switching unit to operate in the open state when a voltage of a ground rail configured to be coupled to a second node of the load circuit is greater than a voltage of the first node of the switching unit.

2. The circuit according to claim 1, wherein the reverse current protection unit couples the second node of the switching unit to the body of the switching unit in response to a voltage of the second node of the switching unit being greater than a voltage of the first node of the switching unit.

3. The circuit according to claim 1, further comprising:
a voltage rail coupled to the first node of the switching unit;

the ground rail; and
the load circuit.

4. A circuit comprising:
a switching unit comprising a first node, a second node, a control node, and a body, wherein the switching unit is configured to selectively couple the first node of the switching unit and the second node of the switching unit in response to receiving a control signal at the control node of the switching unit;
a reverse current protection unit configured to reduce a current flow from the second node of the switching unit to the first node of the switching unit, wherein the reverse current protection unit selectively couples the first node of the switching unit to the body of the switching unit and selectively couples the second node of the switching unit to the body of the switching unit; and
an output node coupled to the second node of the switching unit and configured to be coupled to a first node of a load circuit, wherein the reverse current protection unit comprises:
a first resistive element comprising a first node and a second node, the second node of the first resistive element being coupled to a ground rail configured to be coupled to a second node of the load circuit; and
a first transistor comprising an emitter coupled to the first node of the switching unit, a collector coupled to the body of the switching unit, and a base coupled to the first node of the first resistive element.

5. The circuit according to claim 4, wherein the reverse current protection unit further comprises:
a second resistive element comprising a first node coupled to the first node of the switching unit and a second node; and
a second transistor comprising an emitter coupled to the second node of the switching unit, a collector coupled to the body of the switching unit, and a base coupled to the second node of the second resistive element.

6. The circuit according to claim 5, wherein the reverse current protection unit further comprises:
a third transistor comprising an emitter coupled to the ground rail, a collector coupled to the body of the switching unit, and a base coupled to the second node of the second resistive element.

7. The circuit according to claim 6, wherein the reverse current protection unit couples the body of the switching unit and the ground rail in response to a voltage of the ground rail being greater than a voltage of the first node of the switching unit voltage rail.

8. The circuit according to claim 3, wherein the driver unit is further configured to generate the control signal received at the control node of the switching unit to cause the switching unit to operate in the open state when a voltage of the first node of the load circuit is greater than a voltage of the voltage rail.

9. An integrated circuit comprising:
a driver unit configured to receive an input signal on an input node of the integrated circuit and to generate a control signal in response to the input signal received on the input node;
a switching unit comprising a first node coupled to a voltage rail of the integrated circuit, a second node coupled to an output node of the integrated circuit, and a body, wherein the switching unit is configured to selectively couple the first node of the switching unit and the second node of the switching unit in response to the control signal generated by the driver unit; and
a reverse current protection unit configured to reduce a current flow from the second node of the switching unit to the first node of the switching unit, wherein the reverse current protection unit is configured to selectively couple the first node of the switching unit to the body of the switching unit and to selectively couple the second node of the switching unit to the body of the switching unit and wherein the reverse current protection unit is configured to selectively couple a ground rail of the integrated circuit to the body of the switching unit.

10. The integrated circuit according to claim 9, wherein:
the reverse current protection unit couples the body of the switching unit and the ground rail in response to a voltage of the ground rail being greater than a voltage of the first node of the switching unit.

11. An integrated circuit comprising:
a driver unit configured to receive an input signal on an input node of the integrated circuit and to generate a control signal in response to the input signal received on the input node;
a switching unit comprising a first node coupled to a voltage rail of the integrated circuit, a second node coupled to an output node of the integrated circuit, and a body, wherein the switching unit is configured to selectively couple the first node of the switching unit and the second node of the switching unit in response to the control signal generated by the driver unit; and
a reverse current protection unit configured to reduce a current flow from the second node of the switching unit to the first node of the switching unit, wherein the reverse current protection unit is configured to selectively couple the first node of the switching unit to the body of the switching unit and to selectively couple the second node of the switching unit to the body of the switching unit, wherein the driver unit is configured to compare a voltage of the voltage rail with a voltage of the output node, and wherein the driver unit generates the control signal further in response to the comparison of the voltage of the voltage rail with the voltage of the output node.

12. The integrated circuit according to claim 11, wherein the driver unit generates the control signal to operate the switching unit in an open state when the voltage of the output node is greater than the voltage of the voltage rail, wherein during the open state the switching unit reduces current flow between the voltage rail and the output node.

13. The integrated circuit according to claim 12, wherein the driver unit is further configured to generate the control signal received at the control node of the switching unit to cause the switching unit to operate in the open state when a voltage of a ground rail of the integrated circuit is greater than a voltage of the voltage rail.

14. A semiconductor device comprising:
means for selectively coupling a first node of a switching unit and a second node of the switching unit in response to a control signal;
means for switching a body of the switching unit to reduce a current flow from the second node of the switching unit to the first node of the switching unit; and
means for coupling the body of the switching unit and a ground rail in response to a voltage of the ground rail being greater than a voltage of the first node of the switching unit.

15. The semiconductor device according to claim 14, comprising:
means for generating the control signal.

16. The semiconductor device according to claim 14, comprising:

means for discharging a current from the second node of the switching unit to the ground rail of the semiconductor device.

\* \* \* \* \*

UNITED STATES PATENT AND TRADEMARK OFFICE
CERTIFICATE OF CORRECTION

PATENT NO. : 10,186,859 B2
APPLICATION NO. : 15/059121
DATED : January 22, 2019
INVENTOR(S) : Andrea Logiudice Page 1 of 1

It is certified that error appears in the above-identified patent and that said Letters Patent is hereby corrected as shown below:

In the Claims

Column 17, Claim 7, Line 49: "…switching unit voltage rail." should be changed to --…switching unit.--

Signed and Sealed this
Tenth Day of December, 2019

Andrei Iancu
*Director of the United States Patent and Trademark Office*